United States Patent
Vellanki et al.

(10) Patent No.: US 11,539,331 B2
(45) Date of Patent: Dec. 27, 2022

(54) SIGNAL AMPLITUDE-SELECTED SIGNAL PREDISTORTION IN AN AMPLIFIER

(71) Applicant: CIRRUS LOGIC INTERNATIONAL SEMICONDUCTOR LTD., Edinburgh (GB)

(72) Inventors: Amar Vellanki, Cedar Park, TX (US); Xin Zhao, Austin, TX (US); Jing Bai, Austin, TX (US); John L. Melanson, Austin, TX (US); Ku He, Austin, TX (US); Wai-Shun Shum, Austin, TX (US); Xiaofan Fei, Austin, TX (US); Alan M. Morton, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 0 days.

(21) Appl. No.: 17/348,982

(22) Filed: Jun. 16, 2021

(65) Prior Publication Data
US 2022/0329212 A1    Oct. 13, 2022

Related U.S. Application Data

(60) Provisional application No. 63/173,602, filed on Apr. 12, 2021.

(51) Int. Cl.
*H03F 1/32* (2006.01)
*H04R 3/02* (2006.01)
(Continued)

(52) U.S. Cl.
CPC .............. *H03F 1/32* (2013.01); *H03F 3/183* (2013.01); *H04R 3/02* (2013.01); *H04R 29/001* (2013.01); *H03F 2200/03* (2013.01)

(58) Field of Classification Search
CPC ........ H03F 1/32; H03F 3/183; H03F 2200/03; H04R 3/02; H04R 29/001
(Continued)

(56) References Cited

U.S. PATENT DOCUMENTS 5,815,585 A    9/1998    Klippel
5,848,169 A    12/1998   Clark, Jr. et al.
(Continued)

FOREIGN PATENT DOCUMENTS

GB          2540441         1/2017
WO    WO2003015263 A1      2/2003
(Continued)

OTHER PUBLICATIONS

Combined Search and Examination Report in GB2204541.3 dated Sep. 28, 2022 (pp. 1-9 in pdf).

*Primary Examiner* — Vivian C Chin
*Assistant Examiner* — Friedrich Fahnert
(74) *Attorney, Agent, or Firm* — Andrew M. Harris; Mitch Harris, Atty at Law, LLC

(57) ABSTRACT

An amplification system with an output driver stage for providing an output signal to acoustic output transducers such as speakers or haptic output devices removes signal distortion caused by output stage non-linearities by pre-distorting an input signal. The system includes the output driver stage, an input stage for receiving the input signal, and a processing block that receives the input signal and provides an output signal to the output driver stage. The processing block includes a pre-distortion circuit that applies a pre-distortion function to the input signal to generate the output signal if a signal level of the input signal is greater than a threshold amplitude, and if the signal level is less than
(Continued)

or equal to the threshold amplitude, generates the output signal from the input signal by bypassing the pre-distortion circuit.

31 Claims, 6 Drawing Sheets

(51) Int. Cl.
*H03F 3/183* (2006.01)
*H04R 29/00* (2006.01)

(58) Field of Classification Search
USPC .......................................................... 381/59
See application file for complete search history.

(56) References Cited

U.S. PATENT DOCUMENTS

| | | |
|---|---|---|
| 7,050,770 B1 | 5/2006 | Hutton et al. |
| 7,362,821 B1 | 4/2008 | Shirali |
| 7,502,484 B2 | 3/2009 | Ngia et al. |
| 8,023,588 B1 | 9/2011 | Benson et al. |
| 8,798,559 B2 | 8/2014 | Kilambi et al. |
| 9,231,544 B2 | 1/2016 | Bathgate et al. |
| 9,524,712 B2 | 12/2016 | Vaidhyanathan et al. |
| 9,552,827 B2 | 1/2017 | Johnston et al. |
| 9,607,628 B2 | 3/2017 | Temujin |
| 9,866,180 B2 | 1/2018 | Lesso et al. |
| 10,432,151 B2 | 10/2019 | Lesso et al. |
| 2003/0197559 A1 | 10/2003 | Ghannoucci et al. |
| 2011/0085678 A1* | 4/2011 | Pfaffinger ................ H04R 3/00 381/96 |
| 2014/0029755 A1 | 1/2014 | Kwon et al. |
| 2016/0111110 A1* | 4/2016 | Gautama ............. G10L 21/0316 381/94.3 |

FOREIGN PATENT DOCUMENTS

| | | | |
|---|---|---|---|
| WO | WO-2016181107 A1 * | 11/2016 | ........... H03F 1/3241 |
| WO | WO2016181107 A1 | 11/2016 | |
| WO | WO-2018075442 A1 | 4/2018 | |
| WO | WO-2018101200 A1 * | 6/2018 | |

* cited by examiner

SIGNAL AMPLITUDE-SELECTED SIGNAL PREDISTORTION IN AN AMPLIFIER

The present application Claims priority under 35 U.S.C. § 119(e) to U.S. Provisional Patent Application 63/173,602 filed on Apr. 12, 2021, the disclosure of which is incorporated herein by reference.

BACKGROUND

1. Field of Disclosure

The field of representative embodiments of this disclosure relates to amplifier methods and circuits that correct for harmonic distortion by pre-distorting the amplifier input signal so that the output signal has reduced distortion.

2. Background

Audio output systems that deliver power to acoustic output transducers, such as loudspeakers or micro speakers, and haptic output drivers that supply energy to haptic feedback devices, typically include an analog output driver stage that has non-linear behavior for large signal swings, i.e., for output signals that approach the full power supply voltage(s) supplied to the output devices. In particular, when feedback is not provided directly from the output of the output driver stage, i.e., an open-loop driver stage, the nonlinearities can generate unacceptable signal distortion.

One technique that has been used to reduce output signal distortion caused by an open-loop driver stage is pre-distortion of the input signal provided to the open-loop driver stage. A mathematical correction is applied to an input signal and used to modify the behavior of the output driver stage such that a reduced-distortion output signal is generated by the output driver stage. However, such pre-distortion techniques consume additional power and consume significant additional die area, in particular in multi-channel applications.

Therefore, it would be advantageous to provide an amplifier that reduces open-loop output driver stage distortion, while not incurring the power consumption and die area penalties present in existing solutions.

SUMMARY

Reduced output signal distortion in audio and haptic power output systems having an open-loop output driver stage may be accomplished in amplification systems and their methods of operation.

The systems and methods provide an output signal to acoustic output transducers and include an output driver stage, an input stage for receiving the input signal, and a processing block that receives the input signal and provides an output signal to the output driver stage. The processing block includes a pre-distortion circuit that applies a pre-distortion function to the input signal to generate the output signal if a signal level of the input signal is greater than a threshold amplitude, and if the signal level is less than or equal to the threshold amplitude, generates the output signal from the input signal by bypassing the pre-distortion circuit.

The summary above is provided for brief explanation and does not restrict the scope of the Claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

DETAILED DESCRIPTION OF ILLUSTRATIVE EMBODIMENT

Figure 1:
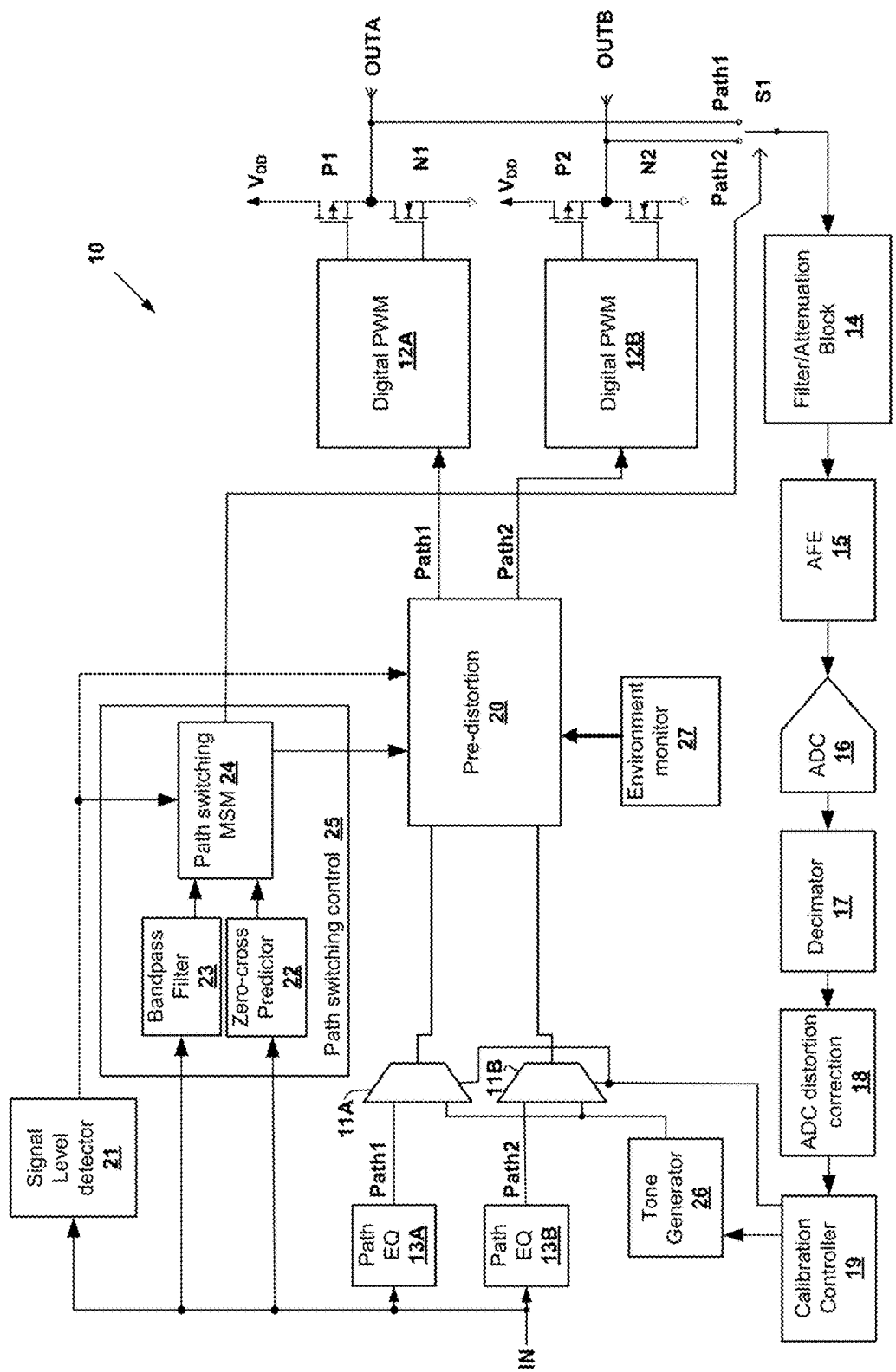
FIG. 1 is a block diagram of an example system 10 in which techniques according to an embodiment of the disclosure are practiced.

The present disclosure encompasses audio amplification systems and other amplification systems with an output driver stage for providing an output signal to acoustic output transducers that convert electrical energy from a drive signal to an acoustic output, such as an acoustic pressure wave or mechanical vibration. Many electronic devices include output transducers such as loudspeakers for playback of audio programs and/or speech, as voice communications equipment. The acoustic output transducers may be those that incorporate an electromagnetic actuator, such as loudspeakers having a voice coil motor coupled to a speaker cone, or in some cases the glass screen of a mobile telephone or tablet. The acoustic output transducers may also be non-electromagnetic devices such as piezoelectric speakers. Acoustic output transducers also include other devices such as haptic output devices designed for generating mechanical vibrations, provided as tactile feedback and/or notifications to a user. The acoustic transducer may be included in an electronic device, as mentioned above, or may be located in a detachable device such as earspeaker. In either case the electronic device will generally generate an analog output signal for driving the acoustic transducer from an output stage of an amplification system.

The amplification system and its method of operation disclosed herein remove signal distortion caused by output stage non-linearities by pre-distorting an input signal. The system includes the output driver stage, an input stage for receiving the input signal, and a processing block that receives the input signal and provides an output signal to the output driver stage. The processing block includes a pre-distortion circuit that applies a pre-distortion function to the input signal to generate the output signal. The pre-distortion may be selectively applied if a signal level of the input signal is greater than a threshold amplitude, and if the signal level is less than or equal to the threshold amplitude, the pre-distortion may be bypassed. The present disclosure illustrates a low power pre-distortion solution for open loop drivers to improve linearity/cancel non-linearity, providing a solution with a shared implementation for multi path audio devices, and a calibration method used to calibrate pre-distortion coefficients of the polynomial(s), which may be telescoping polynomials. The exemplary embodiment includes implementations in which the selection of signal path occurs dynamically, and provides for enabling and disabling pre-distortion under conditions in which pre-distortion is not needed to achieve performance goals, allowing the pre-distortion circuit that performs the polynomial computations to be disabled/powered-down to conserve power when pre-distortion is not needed. To minimize pops, the pre-distortion may be enabled and disabled at zero crossing of input signal IN. If zero cross information is not available, the coefficient terms or the output signal of f(X) may be slowly ramped in small steps to minimize pops. The same techniques may be used when changing coefficients according to a path selection change in a multi-path amplifier system, including ramping down of the coefficients when pre-distortion is being disabled and ramping up coefficients when pre-distortion is being enabled. The zero-crossing detection and ramping controls may be operated during transitions between pre-distortion selection changes to further minimize power. The digital portion of the calibration path may decimate the signal down to a much lower rate, and the calibration engine/processor may calculate the pre-distortion coefficients using either a direct calculation method or by sweeping the coefficients to optimize reduction of harmonic distortion.

Referring now to FIG. 1, a block diagram of an example system 10 is shown, in accordance with an embodiment of the disclosure. Example system 10 is illustrated as a multi-path pulse-width modulated (PWM) audio amplifier having two signal paths: a voltage path Path1 and a current path Path2. While two signal paths are shown for the purposes of illustration, additional signal paths may be included, depending on the particular application, and the signal paths may be any combination of voltage paths and/or current paths without deviating from the spirit and scope of the instant disclosure, which contemplates all such combinations. On voltage path Path1, for large signals, the analog open loop driver exhibits non-linear behavior and introduces distortion that affects the quality of the signal. A digital pre-distortion polynomial computed by a pre-distortion block 20 is provided to cancel large signal distortion in voltage path Path1 and/or the current path Path2. Voltage path Path 1 includes a path equalization block (Path EQ) 13A and a multiplexer 11A that selects between the output of Path EQ 13A and the output of a tone generator 26 provided for calibration under control of a calibration controller 19. Current path Path 2 includes a Path EQ 13B and a multiplexer 11B that selects between the output of Path EQ 13B and the output of tone generator 26. Voltage path Path1 and current path Path2 are both processed by pre-distortion block 20, which digitally computes a polynomial from one or more input signals to generate one or more outputs. If the signal paths in system 10 are used in a mutually-exclusive manner, pre-distortion block 20 may constitute a single channel, which is then shared (multiplexed) among the signal paths, so that a currently-selected signal path is pre-distorted. Sharing pre-distortion block 20 between multiple signal paths reduces die area required to implement system 10 within an integrated circuit (IC) design. However, pre-distortion block 20 may, in some embodiments, provide simultaneous pre-distortion in separate signal paths that operate simultaneously, either by time-division multiplexing the signal paths, or by providing separate pre-distortion computation circuits, according to different embodiments. In the illustrated example system 10, either voltage path Path1 is active or current path Path2 is active, according to an operating mode of system 10 so that the circuits within pre-distortion block 20 are used to provide pre-distortion of the active one of voltage path Path1 or current path Path2.

Voltage path Path1 includes a digital pulse-width modulation block (Digital PWM) 12A and a push-pull open-loop output driver provided by a P-type metal oxide semiconductor field-effect transistor (MOSFET) transistor P1 and an N-type MOSFET transistor N1 to generate an output signal OUTA. Current path Path2 includes a Digital PWM 12B and a push-pull open-loop output driver provided by a P-type MOSFET transistor P2 and an N-type MOSFET transistor N2 to generate an output signal OUTB. Because system 10 does not include a signal feedback loop around the output drivers that generate output signals OUTA and OUTB, harmonic distortion caused by the characteristics of transistors P1, P2, N1 and N2 are not canceled by feedback, which is problematic in particular at high signal levels. Pre-distortion block 20 corrects for some or all of the harmonic distortion produced by the open-loop output drivers implemented by transistors P1, P2, N1 and N2 by pre-distorting the input signal provided by either the output of multiplexer 11A or multiplexer 11B, depending on the operating mode of system 10, to provide an output signal to either digital PWM 12A or digital PWM 12B that includes a pre-distortion component that cancels the distortion caused by the active open-loop output driver. In order to conserve energy, particularly in low-voltage battery-operated systems, pre-distortion block 20 may be selectively operated in response to the output of a signal level detector 21 that detects an amplitude of an input signal IN that provides the input to voltage path Path1 and current path Path2. Signal level detector 21 provides one or more control signals to pre-distortion block 20 so that pre-distortion block 20 is either non-operating at low signal levels and/or has a selectable complexity according to the amplitude of input signal IN, so that portions of pre-distortion block 20 do not consume energy due to their non-operating state and/or disabling of internal power supply rails provided to digital computation circuits within pre-distortion block 20. Signal level detector may have multiple outputs and may include hysteresis on the output(s), to implement the hysteresis described below with reference to FIG. 5, and to select between multiple instances of or portions of pre-distortion block 20 that provide for different polynomial terms and/or different polynomials, depending on signal amplitude. The multiple control outputs may be used to select the multiple instances of or portions of predistortion block 20 and control power management states of the individual elements to conserve energy when computation of more complex polynomials is not required, e.g., at lower signal levels.

A path-switching control block 25 also provides control signals to pre-distortion block 20 according to a path-switching master state machine (MSM) 24 that selects an active signal path, e.g., either voltage path Path 1 or current path Path 2, for example according to input signal level detected at the output of a bandpass filter 23, and which may be synchronized by a zero-cross predictor 22 that predicts an occurrence of a next zero amplitude crossing of input signal IN, so that path switching can be accomplished with minimal disruption to system 10. Changes in the pre-distortion characteristic applied by pre-distortion block 20 are also synchronized by path switching MSM 24, which may include changes due to selection of the active signal path and changes due to signal-level indications provided by signal level detector 21. Additionally, commands that change the selected path on the fly may also trigger path switching MSM 24 to begin coefficient ramping and switching of coefficients, generally by ramping the present set of coefficients down, switching coefficients and then ramping coefficients up. Other schemes that "morph" between coefficient sets may be employed, in particular if a DSP is used to control the coefficient values. An environment monitor 27 may monitor both device temperature and power supply voltage in order to provide information to pre-distortion block. The polynomial coefficients and/or the number of harmonic terms used by pre-distortion block may be adjusted on the fly when device temperature changes, when the power supply voltage provided to the output drivers changes, or when the path selection changes, so that different polynomials are used to pre-distort the input signal over varying conditions and selected signal path. The digital pre-distortion block may be dynamically turned on and off based on signal amplitude level to minimize power consumption and maximize power efficiency without compromising linearity.

Calibration of coefficients with pre-distortion block 20 that determine the pre-distortion characteristic applied to the input signal(s) provided by the outputs of multiplexers 11A, 11B may be performed under control of calibration controller 19. Calibration may be performed in response to detection of the above-mentioned device temperature or power supply changes, or may be triggered periodically by a timer. The calibration path may be enabled and operated whenever the coefficients need to be updated due to voltage or temperature effects. Factory calibration may be performed using calibration tones, which may be a single in-band tone with the measurement circuitry high-pass filtering the output signal to remove the tone, leaving the distortion, which may then be measured. Alternatively, a pair of out-of-band tones may be applied, with low-pass filtering applied to remove the tones, leaving the lower-frequency mixing products between the tones, which provides a measure of the distortion/non-linearity of the output drivers. The measurement analog-to-digital converter (ADC) used to measure the distortion may itself generate distortion, which may be canceled in the calibration. A switch S1 selects either output OUTA or output OUTB for calibration. A filter/attenuation block 14 scales and filters the selected output signal provided from switch S1 for further processing by an analog front-end (AFE) 15 and conversion by an analog-to-digital converter (ADC) 16, an output of which is decimated by a decimator 17 to provide a digital representation of the selected output signal OUTA, OUTB to calibration controller. An ADC distortion correction block 18 may be provided to correct for error and distortion in the signal path from switch S1 through AFE 15 and ADC 16.

In order to calibrate pre-distortion block 20, calibration controller 19 operates multiplexers 11A, 11B to provide the output of tone generator 25, which may be a sine-wave, for example, to provide the input to pre-distortion block. Calibration controller 19 operates switch S1 to select which signal path to calibrate by selecting one of outputs OUTA, OUTB. Calibration controller 19 may then perform an analysis of the converted output signal provided at the output of ADC distortion correction 18, for example, by computing a fast-Fourier transform (FFT) on the values to detect harmonic distortion components of the signal on the selected output that are caused by non-linearity of the signal path. In example system 10, pre-distortion block 20 computes a polynomial that is applied to the active input(s) of pre-distortion block 20 to generate a pre-distorted output signal(s) provided to one or both of digital PWMs 12A, 12B. Since, in general, the order of a harmonic distortion component, i.e., the harmonic frequency multiplier corresponds directly to a non-linearity of the same polynomial order exponent, e.g., third harmonic distortion at 3× the frequency of a fundamental is generated by a non-linearity of the form $y=x+a_3x^3$, where x is the undistorted signal.

Calibration controller 19 may detect the level of distortion at one or more harmonics of a sine wave injected by tone generator 25 and determine coefficients of pre-distortion block as needed to cancel a particular amount of harmonic distortion, e.g., $y=x+a_3x^3$ yields a signal without third harmonic distortion when x is pre-distorted such that $y=(x-C_3 x^3)+a_3(x-C_3x^3)^3$, which for small values of distortion and pre-distortion coefficients yields $y \approx (x-C_3 x^3)+a_3x^3=x$ if $C_3=a_3 \ll 1$. The pre-distortion components may be further corrected based on higher harmonics if needed. For example, the first (partially) neglected error term in the above expression is $3a_3C_3x^5$, which has a fifth harmonic component that may be included in an adjustment of a fifth-order polynomial term $C_5$. (A small third harmonic component due to this term is accounted for in $C_3$.) All of the higher-order error terms are proportional to $C_3^2$ and $C_3^3$, which may be discarded, since $C_3 \ll 1$. Similar analyses and correction apply for other harmonic distortion terms. In general, pre-distortion block 20 applies a correction:

$$Y(n)=\Sigma_{k=1}^M \Sigma_{j=0}^P (C_{kj} X^k(n-j)),$$

where M is the order of the polynomial solution, and P is equal to the number of delay terms included in each coefficient computation. An example pre-distortion polynomial is given by:

$$Y(n)=C_1 X(n)+C_3 X^3(n)+C_{31} X^3(n-1)+C_5 X^5(n)$$

Recalibration may be performed by automatic duty cycling, e.g., in response to a timer, or may be triggered by a circuit detecting temperature or voltage changes. The recalibration may be performed in order to minimize the overall average power consumption.

Figure 2:
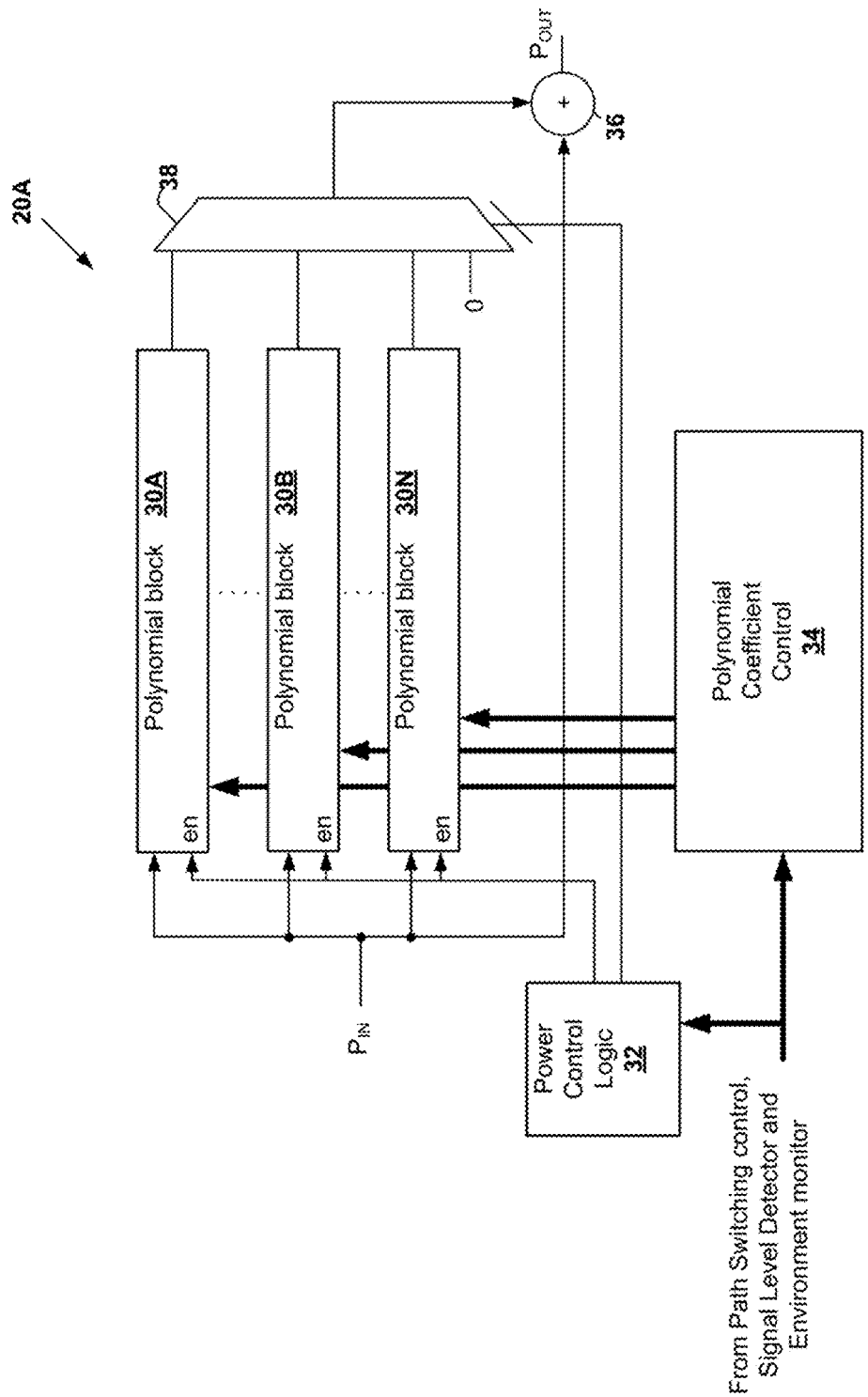
FIG. 2 is a block diagram illustrating an example pre-distortion circuit 20A that may be used to implement pre-distortion block 20 in example system 10 of FIG. 1.

Referring now to FIG. 2, a block diagram illustrating an example pre-distortion circuit 20A that may be used to implement pre-distortion block 20 in example system 10 of FIG. 1 is shown. In the illustrated example, which is a simplified example compared to the implementation described below with reference to FIG. 3 and FIG. 4, pre-distortion circuit 20A includes multiple polynomial blocks 30A, 30B . . . 30N that are provided to receive a digital input signal $P_{in}$. A multiplexor 38 selects one of the outputs of polynomial blocks 30A, 30B . . . 30N and a summer 36 adds input signal $P_{in}$ to the output of multiplexer 38 to produce the output signal $P_{OUT}$ as the pre-distorted output signal for reproduction by the output stage of system 10 to produce an undistorted output signal (or a signal with reduced distortion). A power control logic 32 receives information from path switching control 25, signal level detector 21 and environment monitor 27 of FIG. 1 and asserts control signals provided to enable inputs en of polynomial blocks 30A, 30B . . . 30N to disable unused ones of polynomial blocks 30A, 30B . . . 30N. Power control logic 32 also provides selection signals to multiplexer 38, and under certain conditions such as low input signal level, may disable pre-distortion entirely. A polynomial coefficient control block 34 provides coefficient information to polynomial blocks 30A, 30B . . . 30N to determine the characteristics of the pre-distortion, including the number of terms to be computed and applied. While polynomial blocks 30A, 30B . . . 30N will generally be implemented with dedicated computation stages, a digital signal processor (DSP) may be used to provide the functions of polynomial blocks 30A, 30B . . . 30N, as well as the remainder of pre-distortion circuit 20A.

Figure 3:
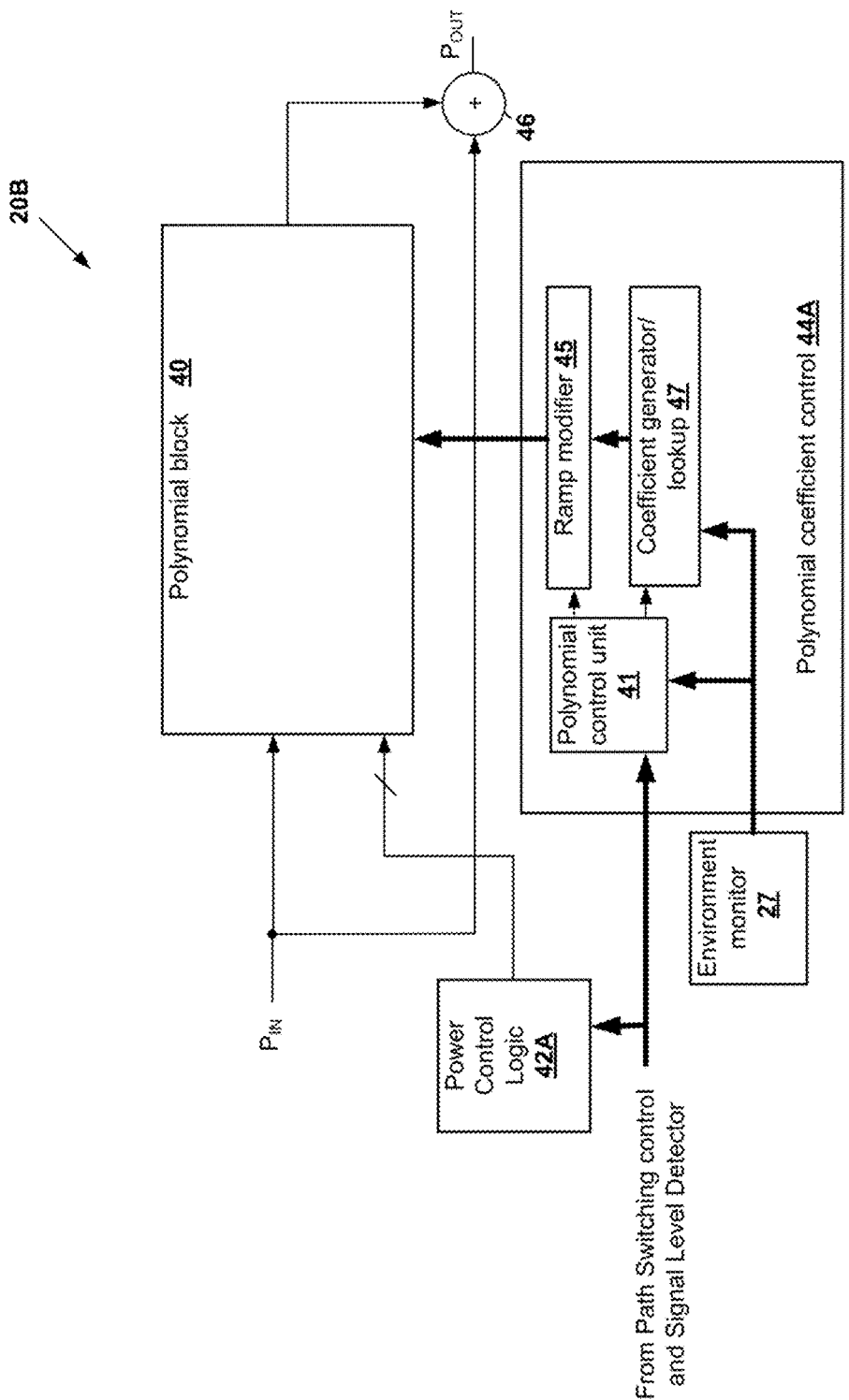
FIG. 3 is a block diagram illustrating another example pre-distortion circuit 20B that may be used to implement pre-distortion block 20 in example system 10 of FIG. 1.

FIG. 3 is a block diagram illustrating another example pre-distortion circuit 20B that may be used to implement pre-distortion block 20 in the example system of FIG. 1. Instead of multiple polynomial blocks 30A, 30B . . . 30N that may be enabled/disabled to conserve energy, pre-distortion circuit 20B includes a single polynomial block 40 that is re-configurable to generate different orders of polynomial, while disabling portions of polynomial block 40 that are not needed for the currently selected pre-distortion. A polynomial coefficient control 44A includes a coefficient generator or lookup 47 that provides an input to a ramp modifier block 45 that scales the individual coefficients, (e.g., linearly from zero to their full value) in response to indications from a polynomial control unit 41 that receives input from path switching control 25 and signal level detector 21 and environment monitor 27, as described above with reference to FIG. 1. Ramp modifier 45 performs ramping up and ramping down of coefficients at path switches or polynomial changes as described above. A summer 46 combines the output of polynomial block 40 with input signal $P_{in}$ to produce the output signal $P_{OUT}$ as the pre-distorted output signal for reproduction by the output stage of system 10 to produce an undistorted output signal (or a signal with reduced distortion). A power control logic 42A controls the power management (enabled/disabled) stage of various elements within polynomial block 40 to conserve energy when the disabled elements are not needed to generate pre-distortion.

Figure 4:
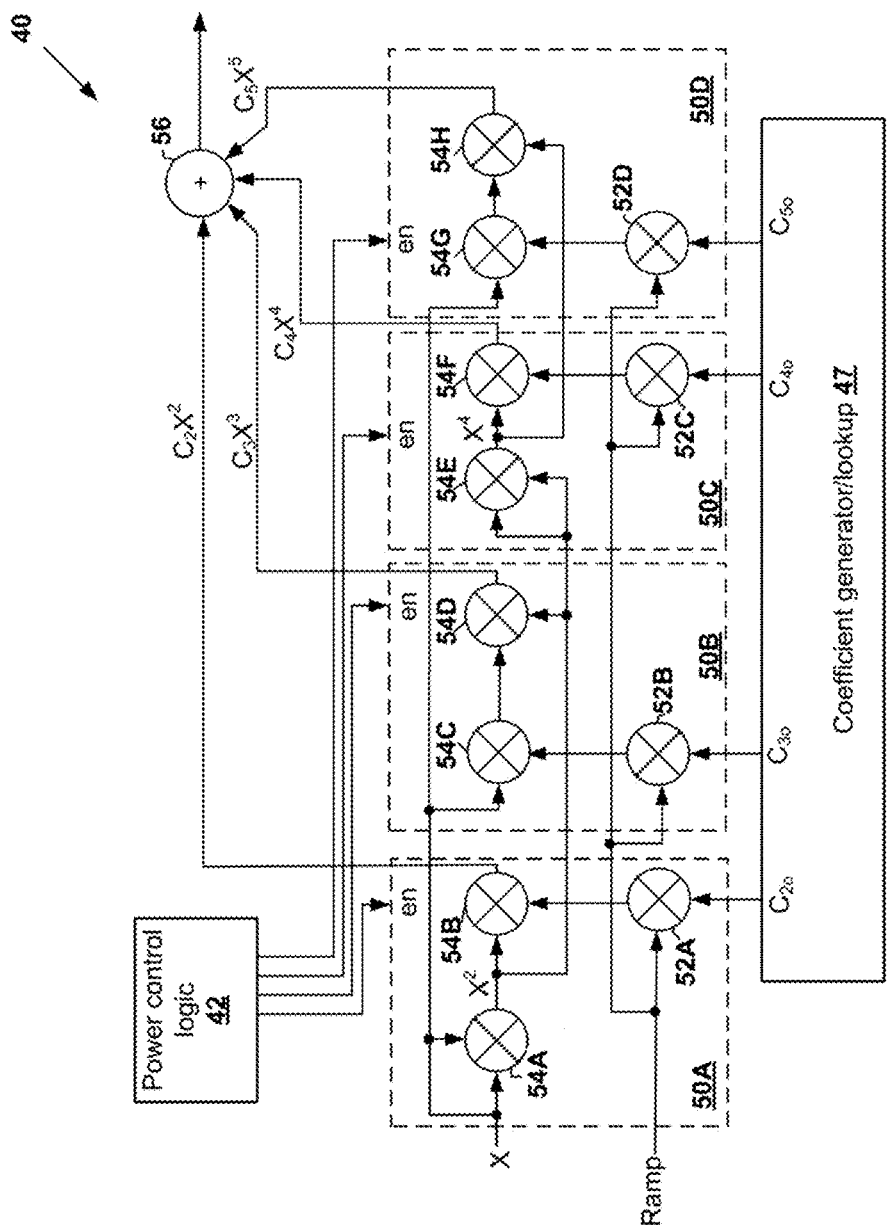
FIG. 4 is a block diagram illustrating details of an example polynomial circuit that may be used to implement polynomial block 40 in example pre-distortion circuit 20B of FIG. 3.

Referring now to FIG. 4, a block diagram illustrating details of an example polynomial circuit that may be used to implement polynomial block 40 in example pre-distortion circuit 20B of FIG. 3 is shown. A plurality of polynomial term blocks 50A-50D receive coefficients from coefficient generator/lookup block 47, that are selected/computed. Only non-delayed terms (j=0) in the full polynomial are shown, for simplicity of illustration. The coefficients are provided to an input of a corresponding ramp multiplier 52A-52D within each of polynomial term blocks 50A-50D that multiply the coefficients by a ramp value that may be, e.g., between 0 and 1. The outputs of ramp multipliers 52A-52D are provided to an input of a corresponding multiplier 54B, 54D, 54F, 54II that multiplies the coefficient by portion of the polynomial term that is dependent on computational efficiency and to minimize/equalize delay. For polynomial term block 50A, a separate multiplier 54A generates the square $X^2$ of an input signal X, which is then multiplied by coefficient $C_{20}$, subject to any scaling according to ramp value Ramp to generate polynomial term $C_2 X^2$. In polynomial term block 50B, a multiplier 54C multiplies coefficient $C_{30}$ by input signal X and multiplier 54D multiplies the result $C_3 X$ by the output $X^2$ of multiplier 54A to generate coefficient term $C_2 X^2$. In polynomial term block 50C, a multiplier 54E multiplies the output of multiplier 54A by itself to generate $X^4$ and multiplier 54D multiplies the output of multiplier 54C by coefficient $C_{40}$ to generate coefficient term $C_4 X^4$. In polynomial term block 50D, multiplier 54G multiplies coefficient $C_{40}$ by input signal X and multiplier 54H multiplies the result $C_4 X$ by the output of multiplier 54E to generate coefficient term $C_5 X^5$. The illustrated circuit may be extended for further polynomial terms by adding two multipliers for each additional term according to the illustrated pattern. The pattern may be duplicated for delayed versions of input signal X contributing to the polynomial. All of the polynomial terms are then combined by a summer 56 to generate the output of pre-distortion block 40. A power control logic block 42 enables the individual polynomial term blocks 50A-50D to include the polynomial terms as needed by asserting control signal en at each individual one of polynomial term blocks 50A-50D. In the illustrated example, blocks to the left of an enabled polynomial term block also must be enabled. However, it is possible to provide more granular power-management control. For example, if the second order term is not needed, but at least one of the fourth order or the fifth order terms are needed, multiplier 54A may be maintained in an enabled state while multipliers 52A and 54B are disabled.

Figure 5:
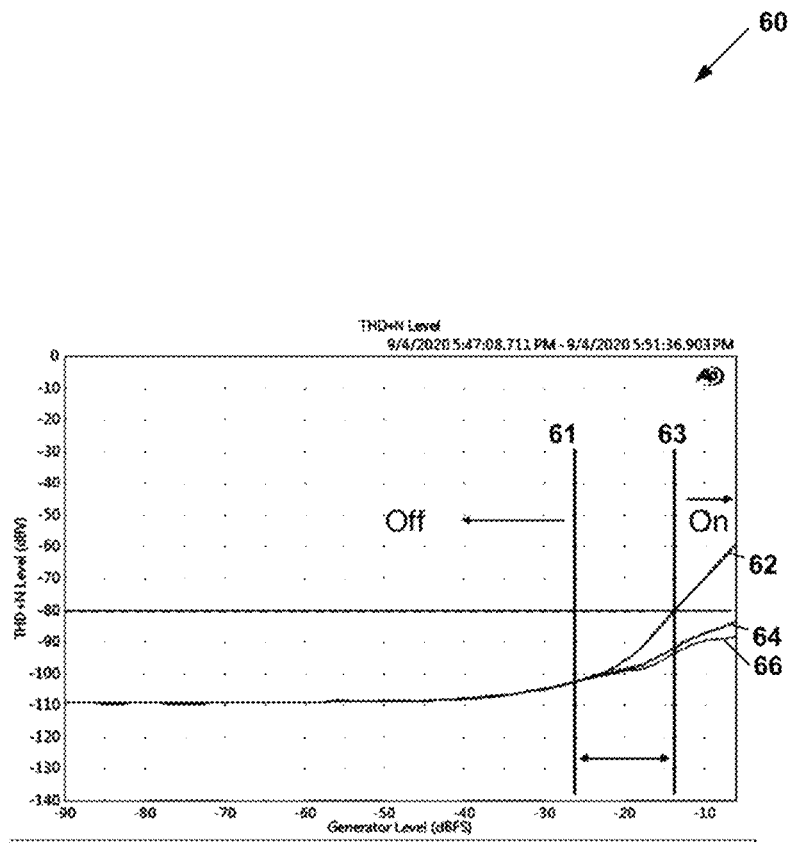
FIG. 5 is a graph illustrating operation of example system 10 of FIG. 1 in accordance with an embodiment of the disclosure.

Referring now to FIG. 5, a graph 60 illustrating operation of the example system of FIG. 1 in accordance with an embodiment of the disclosure is shown. A signal amplitude level threshold is determined from the amplitude vs distortion plot shown in FIG. 5. Line 62 is a graph of total harmonic distortion (THD) with pre-distortion disabled. Line 64 and line 66 are graphs of THD with pre-distortion enabled with two different sets of coefficients. Vertical line 61 indicates an amplitude level below which pre-distortion is always disabled and vertical line 63 indicates an amplitude threshold at which pre-distortion is enabled. Thus, the range between vertical line 61 and vertical line 63 is a hysteresis window, which when crossed, enables pre-distortion and pre-distortion remains on if the signal level falls back into, but not below vertical line 61. Once the signal level falls below the vertical line 61, pre-distortion is again disabled. In order to conserve energy, a low power detection circuit corresponding to the upper threshold may be the only portion of signal level detector 21 of FIG. 1 that is always enabled. Once the low power signal level detection circuit detects that the signal level has crossed a threshold level, zero-cross predictor 22 and the circuits that perform coefficient ramping, setting the coefficients and activating pre-distortion are enabled.

Figure 6A:
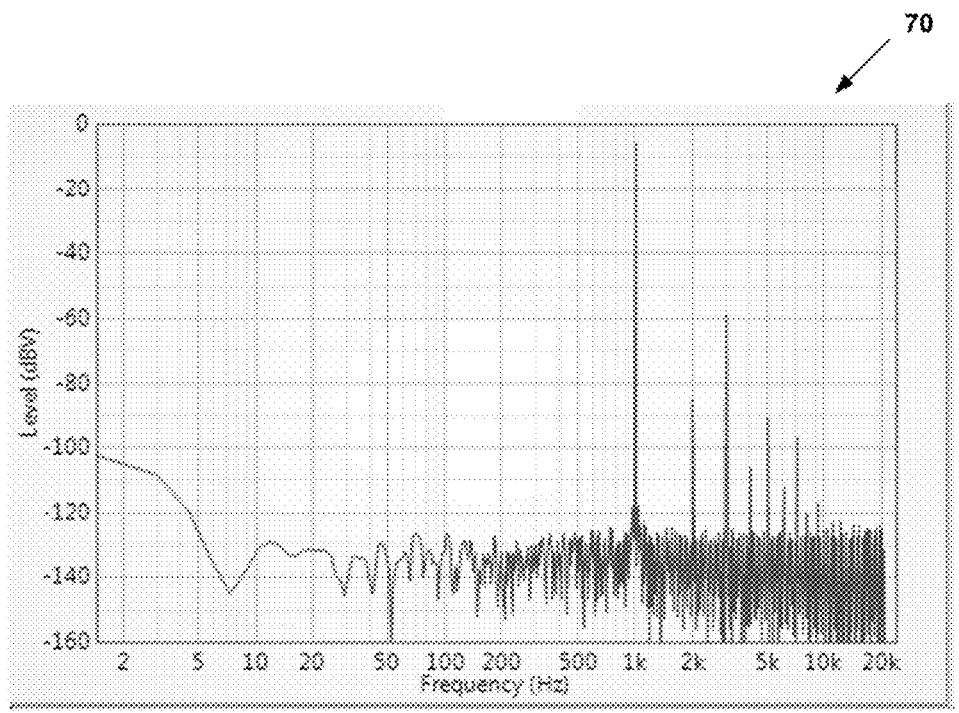
FIG. 6A is a graph illustrating operation of example system 10 of FIG. 1 without pre-distortion.
Figure 6B:
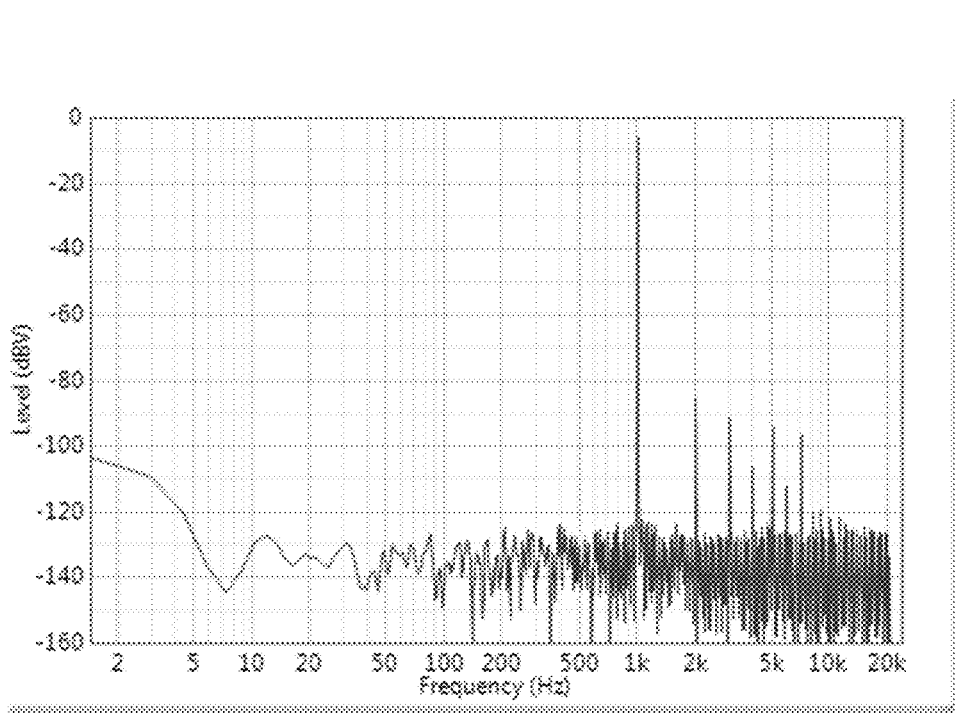
FIG. 6B is a graph illustrating operation of example system 10 of FIG. 1 with pre-distortion in accordance with an embodiment of the disclosure.

Referring now to FIG. 6A a graph 70 is shown, illustrating an output signal of the example system of FIG. 1 without pre-distortion in response to a 1 kHz sine wave input signal, and referring to FIG. 6B a graph 72 is shown, illustrating an output signal of the example system of FIG. 1 with pre-distortion in accordance with an embodiment of the disclosure. The particular implementation of the pre-distortion generating the effect visible in FIG. 6B include only the third order coefficient $C_3$. The resulting spectrum shows a suppression of third harmonic distortion on the order of 34 dB as expected, with some minor improvement (−4 dB) in the level of fifth harmonic.

In summary, this disclosure shows and describes circuits, systems and methods that selectively apply pre-distortion to an input signal of an amplifier in order to reduce harmonic distortion when signal amplitudes are greater than a threshold amplitude. The methods are methods of operation of an amplification system that may include an input stage for receiving an input signal to be amplified, an output driver stage for providing a drive signal to an acoustic output transducer, and a processing block for receiving the input signal and providing an output signal to the output driver stage. The processing block may include a pre-distortion circuit that applies a pre-distortion function to the input signal to generate the output signal if a signal level of the input signal is greater than a threshold amplitude, and if the signal level is less than or equal to the threshold amplitude, the processing block may generate the output signal from the input signal by bypassing the pre-distortion circuit. In some embodiments, the processing block may further disable the pre-distortion circuit if the signal level is less than the threshold amplitude, in order to conserve energy consumed by the amplification system. In some embodiments, the pre-distortion circuit may compute the output signal by applying a polynomial or telescoped polynomial to values of the input signal.

In some embodiments, the processing block may, subsequent to determining that the signal level is greater than or equal to the threshold amplitude and controlling the pre-distortion circuit to apply the pre-distortion function to modify the input signal, determine whether or not that the signal level is greater than another threshold amplitude less than the threshold amplitude by an amplitude hysteresis value and if the signal level is greater than the another threshold amplitude, the processing block may continue to apply the pre-distortion function to the input signal to generate the modified signal. The processing block may, responsive to determining that the signal level is less than or equal to the other threshold amplitude, bypass the pre-distortion circuit, whereby the amplifier amplifies the input signal without pre-distortion. In some embodiments, the output driver stage may be part of one of multiple amplification paths of the amplification system that are selectively enabled, and the processing block may receive an indication to change selection between the multiple amplification paths and responsive to receiving the indication, change a currently-selected one of the multiple amplification paths to another newly-selected one of the multiple amplification paths for amplifying the input signal and further responsive to receiving the indication, the processing block may change one or both of the amplitude threshold or the pre-distortion function in conformity with the another newly-selected one of the multiple amplification paths.

In some embodiments, the processing block, subsequent to determining that the signal level is greater than or equal to the threshold amplitude and the pre-distortion circuit applying the pre-distortion function to modify the input signal, determines whether or not that the signal level is greater than another threshold amplitude greater than the threshold amplitude, and responsive to determining that the signal level is greater than the another threshold amplitude, causes the pre-distortion circuit to apply another pre-distortion function to the input signal to generate the output signal, so that the pre-distortion function used to generate the output signal is varied with the amplitude of the input signal. The processing block may, responsive to determining that the signal level is less than the threshold amplitude, disable the pre-distortion circuit to conserve energy consumed by the amplifier, and responsive to determining that the signal level is greater than or equal to the threshold amplitude, enable a portion of the pre-distortion circuit that applies the pre-distortion function to the signal to conserve energy consumed by the amplifier. The processing block may, responsive to determining that the signal level is greater than the another threshold amplitude, enable another portion of the pre-distortion circuit that applies the another pre-distortion function used to generate the modified signal, wherein energy consumption of the pre-distortion circuit is dependent on whether the pre-distortion function or the another pre-distortion function is being applied to the input signal.

In some embodiments, the processing block may, responsive to determining that the signal level is greater than the threshold amplitude, apply a time-variant scaling function to the pre-distortion function to ramp up the effect of the pre-distortion function on the output signal to prevent transients due to enabling pre-distortion. The processing block may, subsequent to and during application of the pre-distortion function to the input signal and responsive to determining that the signal level is less than or equal to the threshold amplitude, apply a time-variant scaling function to the pre-distortion function to ramp down the effect of the pre-distortion function on the output signal to prevent transients due to disabling pre-distortion.

In some embodiments, the processing block may detect a change in a power supply voltage received by the amplifier or a device temperature of the amplification system and adjust one or both of the amplitude threshold or the pre-distortion function in conformity with the change in the power supply voltage or the device temperature. The processing block may detect zero-crossings of the input signal, and delay a change between applying the pre-distortion function to the input signal or amplifying the unmodified input signal to synchronize the change to a zero-crossing of the input signal. The processing block may measure an output of the output driver and removes fundamental components of the measured output to determine a measure of distortion of the output signal, and the processing block may adjust the pre-distortion function of the pre-distortion circuit according to a result of the measuring. The measuring may be performed responsive to detecting a change in a power supply voltage received by the amplification system or a device temperature of the amplifier. The measuring may be performed periodically according to a timer. The output driver stage may be an open loop output driver stage. The output driver stage may be a current driver that provides an output current proportional to the input signal or the output driver stage may be a voltage driver that provides an output voltage proportional to the input signal.

It should be understood, especially by those having ordinary skill in the art with the benefit of this disclosure, that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense. Similarly, although this disclosure makes reference to specific embodiments, certain modifications and changes may be made to those embodiments without departing from the scope and coverage of this disclosure. Moreover, any benefits, advantages, or solutions to problems that are described herein with regard to specific embodiments are not intended to be construed as a critical, required, or essential feature or element.

While the disclosure has shown and described particular embodiments of the techniques disclosed herein, it will be understood by those skilled in the art that the foregoing and other changes in form, and details may be made therein without departing from the spirit and scope of the disclosure. For example, the pre-distortion techniques of the disclosed embodiments may be used in analog signal amplifiers, e.g., linear amplifiers.

What is claimed is:

1. A method of reducing distortion in an amplifier for providing a drive signal to an acoustic output transducer, the amplifier comprising:

determining whether a signal level of an input signal being amplified by the amplifier is greater than a threshold amplitude;

responsive to determining that the signal level is greater than the threshold amplitude, applying a pre-distortion function to the input signal that cancels distortion introduced by the amplifier prior to amplification by the amplifier, whereby the amplifier amplifies a modified signal; and responsive to determining that the signal level is less than or equal to the threshold amplitude, amplifying the input signal without applying the pre-distortion function to the signal.

2. The method of claim 1, further comprising responsive to determining that the signal level is less than the threshold amplitude, disabling a pre-distortion circuit that applies the pre-distortion function to the signal to conserve energy consumed by the amplifier.

3. The method of claim 1, wherein the applying a pre-distortion function to the input signal comprises computing the modified signal by applying a polynomial or telescoped polynomial to values of the input signal.

4. The method of claim 1, further comprising:
subsequent to determining that the signal level is greater than or equal to the threshold amplitude and applying the pre-distortion function to modify the input signal, determining whether or not that the signal level is greater than another threshold amplitude less than the threshold amplitude by an amplitude hysteresis value;
responsive to determining that the signal level is greater than the another threshold amplitude, continuing to apply the pre-distortion function to the input signal to generate the modified signal; and
responsive to determining that the signal level is less than or equal to the another threshold amplitude, ceasing application of the pre-distortion function to the signal, whereby the amplifier amplifies the input signal without pre-distortion.

5. The method of claim 1, wherein the amplifier includes multiple amplification paths that are selectively enabled, and wherein the method further comprises:
receiving an indication to change selection between the multiple amplification paths; and
responsive to receiving the indication, changing a currently-selected one of the multiple amplification paths to another newly-selected one of the multiple amplification paths for amplifying the signal; and
further responsive to receiving the indication, changing one or both of the amplitude threshold or the pre-distortion function in conformity with the another newly-selected one of the multiple amplification paths.

6. The method of claim 1, further comprising:
subsequent to determining that the signal level is greater than or equal to the threshold amplitude and applying the pre-distortion function to modify the input signal, determining whether or not that the signal level is greater than another threshold amplitude greater than the threshold amplitude;
responsive to determining that the signal level is greater than the another threshold amplitude, applying another pre-distortion function to the input signal to generate the modified signal, whereby the pre-distortion function used to generate the modified signal is varied with the amplitude of the input signal.

7. The method of claim 6, further comprising:
responsive to determining that the signal level is less than the threshold amplitude, disabling a pre-distortion circuit that applies the pre-distortion function to the signal to conserve energy consumed by the amplifier;

responsive to determining that the signal level is greater than or equal to the threshold amplitude, enabling a portion of the pre-distortion circuit that applies the pre-distortion function to the signal to conserve energy consumed by the amplifier; and responsive to determining that the signal level is greater than the another threshold amplitude, enabling another portion of the pre-distortion circuit that applies the another pre-distortion function used to generate the modified signal, wherein energy consumption of the pre-distortion circuit is dependent on whether the pre-distortion function or the another pre-distortion function is being applied to the input signal.

8. The method of claim 1, further comprising responsive to determining that the signal level is greater than the threshold amplitude, applying a time-variant scaling function to the pre-distortion function to ramp up the effect of the pre-distortion function on the modified signal to prevent transients due to enabling pre-distortion.

9. The method of claim 8, further comprising subsequent to and during application of the pre-distortion function to the input signal and responsive to determining that the signal level is less than or equal to the threshold amplitude, applying a time-variant scaling function to the pre-distortion function to ramp down the effect of the pre-distortion function on the modified signal to prevent transients due to disabling pre-distortion.

10. The method of claim 1, further comprising detecting a change in a power supply voltage received by the amplifier or a device temperature of the amplifier, adjusting one or both of the amplitude threshold or the pre-distortion function in conformity with the change in the power supply voltage or the device temperature.

11. The method of claim 1, further comprising:
detecting zero-crossings of the input signal; and
delaying a change between applying the pre-distortion function to the input signal or amplifying the unmodified input signal to synchronize the change to a zero-crossing of the input signal.

12. The method of claim 1, further comprising:
measuring an output of the amplifier to determine a measure of distortion of the output signal of the amplifier;
removing fundamental components due to the input signal from a result of the measuring; and
adjusting the pre-distortion function according to a result of the removing.

13. The method of claim 12, wherein the measuring is performed responsive to detecting a change in a power supply voltage received by the amplifier or a device temperature of the amplifier.

14. The method of claim 12, wherein the measuring is performed periodically according to a timer.

15. An amplification system for providing an output drive signal to an acoustic output transducer, comprising:
an input stage for receiving an input signal to be amplified;
an output driver stage for providing the drive signal to the acoustic output transducer; and
a processing block for receiving the input signal and providing an output signal to the output driver stage, wherein the processing block comprises a pre-distortion circuit that applies a pre-distortion function to the input signal that cancels distortion introduced by the output driver stage to generate the output signal if a signal level of the input signal is greater than a threshold amplitude, and if the signal level is less than or equal to the threshold amplitude, generates the output signal from the input signal by bypassing the pre-distortion circuit.

16. The amplification system of claim 15, wherein the processing block further disables the pre-distortion circuit if the signal level is less than the threshold amplitude to reduce energy consumed by the amplification system.

17. The amplification system of claim 15, wherein the pre-distortion circuit computes the output signal by applying a polynomial or telescoped polynomial to values of the input signal.

18. The amplification system of claim 15, wherein the processing block, subsequent to determining that the signal level is greater than or equal to the threshold amplitude and controlling the pre-distortion circuit to apply the pre-distortion function to modify the input signal, determines whether or not that the signal level is greater than another threshold amplitude less than the threshold amplitude by an amplitude hysteresis value and if the signal level is greater than the another threshold amplitude, continues to apply the pre-distortion function to the input signal to generate the modified signal, and wherein the processing block, responsive to determining that the signal level is less than or equal to the another threshold amplitude, bypasses the pre-distortion circuit, whereby the amplifier amplifies the input signal without pre-distortion.

19. The amplification system of claim 15, wherein the output driver stage is part of one of multiple amplification paths of the amplification system that are selectively enabled, and wherein the processing block receives an indication to change selection between the multiple amplification paths and responsive to receiving the indication, changes a currently-selected one of the multiple amplification paths to another newly-selected one of the multiple amplification paths for amplifying the input signal and further responsive to receiving the indication, changes one or both of the amplitude threshold or the pre-distortion function in conformity with the another newly-selected one of the multiple amplification paths.

20. The amplification system of claim 15, wherein the processing block, subsequent to determining that the signal level is greater than or equal to the threshold amplitude and the pre-distortion circuit applying the pre-distortion function to modify the input signal, determines whether or not that the signal level is greater than another threshold amplitude greater than the threshold amplitude, and wherein the processing block, responsive to determining that the signal level is greater than the another threshold amplitude, causes the pre-distortion circuit to apply another pre-distortion function to the input signal to generate the output signal, whereby the pre-distortion function used to generate the output signal is varied with the amplitude of the input signal.

21. The amplification system of claim 20, wherein the processing block, responsive to determining that the signal level is less than the threshold amplitude, disables the pre-distortion circuit to conserve energy consumed by the amplifier, and responsive to determining that the signal level is greater than or equal to the threshold amplitude, enables a portion of the pre-distortion circuit that applies the pre-distortion function to the signal to conserve energy consumed by the amplifier, and responsive to determining that the signal level is greater than the another threshold amplitude, enables another portion of the pre-distortion circuit that applies the another pre-distortion function used to generate the modified signal, wherein energy consumption of the pre-distortion circuit is dependent on whether the pre-distortion function or the another pre-distortion function is being applied to the input signal.

22. The amplification system of claim 15, wherein the processing block, responsive to determining that the signal level is greater than the threshold amplitude, applies a time-variant scaling function to the pre-distortion function to ramp up the effect of the pre-distortion function on the output signal to prevent transients due to enabling pre-distortion.

23. The amplification system of claim 22, wherein the processing block, subsequent to and during application of the pre-distortion function to the input signal and responsive to determining that the signal level is less than or equal to the threshold amplitude, applies a time-variant scaling function to the pre-distortion function to ramp down the effect of the pre-distortion function on the output signal to prevent transients due to disabling pre-distortion.

24. The amplification system of claim 15, wherein the processing block further detects a change in a power supply voltage received by the amplifier or a device temperature of the amplification system, adjusts one or both of the amplitude threshold or the pre-distortion function in conformity with the change in the power supply voltage or the device temperature.

25. The amplification system of claim 15, wherein the processing block further detects zero-crossings of the input signal, and delays a change between applying the pre-distortion function to the input signal or amplifying the unmodified input signal to synchronize the change to a zero-crossing of the input signal.

26. The amplification system of claim 15, wherein the processing block measures an output of the output driver and removes fundamental components of the measured output to determine a measure of distortion of the output signal, and wherein the processing block adjusts the pre-distortion function of the pre-distortion circuit according to a result of the measuring.

27. The amplification system of claim 26, wherein the measuring is performed responsive to detecting a change in a power supply voltage received by the amplification system or a device temperature of the amplifier.

28. The amplification system of claim 26, wherein measuring is performed periodically according to a timer.

29. The amplification system of claim 15, wherein the output driver stage is an open loop output driver stage.

30. The amplification system of claim 15, wherein the output driver stage is a current driver that provides an output current proportional to the input signal.

31. The amplification system of claim 15, wherein the output driver stage is a voltage driver that provides an output voltage proportional to the input signal.

* * * * *

UNITED STATES PATENT AND TRADEMARK OFFICE
CERTIFICATE OF CORRECTION

| | |
|---|---|
| PATENT NO. | : 11,539,331 B2 |
| APPLICATION NO. | : 17/348982 |
| DATED | : December 27, 2022 |
| INVENTOR(S) | : Vellanki et al. |

It is certified that error appears in the above-identified patent and that said Letters Patent is hereby corrected as shown below:

In the Specification

In Column 7, Line 46, delete "5411" and insert -- 54H --, therefor.

Signed and Sealed this
Twenty-first Day of February, 2023

Katherine Kelly Vidal
*Director of the United States Patent and Trademark Office*